United States Patent [19]

de Masi

[11] Patent Number: 4,791,458
[45] Date of Patent: Dec. 13, 1988

[54] MULTI-PURPOSE APPARATUS FOR THE IMAGING OF PRINTED WIRED BOARDS

[76] Inventor: Amerigo de Masi, Brandenburgerstr. 62, Egelsbach, Fed. Rep. of Germany

[21] Appl. No.: 88,012

[22] Filed: Aug. 18, 1987

Related U.S. Application Data

[63] Continuation of Ser. No. 929,978, Nov. 13, 1986, abandoned.

[51] Int. Cl.⁴ ............................................. G03B 27/58
[52] U.S. Cl. ........................................................ 355/53
[58] Field of Search ............................. 355/18, 53, 77

[56] References Cited

U.S. PATENT DOCUMENTS

| | | | |
|---|---|---|---|
| 4,093,378 | 6/1978 | Horr et al. | 355/53 X |
| 4,155,642 | 5/1979 | Lacombat | 355/53 |
| 4,189,230 | 2/1980 | Zasio | 355/53 X |
| 4,358,198 | 11/1982 | Moriyama et al. | 355/53 |
| 4,448,518 | 5/1984 | Nishida et al. | 355/18 X |

*Primary Examiner*—Donald A. Griffin
*Attorney, Agent, or Firm*—Robert J. Koch

[57] ABSTRACT

A multi-purpose ultra-violet exposure frame used to prepare a photomask for the imaging of Printed Wired Boards and used as a production tool with UV exposing machine, for manufacture of multiple or single imaged PWB on a single panel of dielectric base material. The apparatus includes movable pins for transport of a panel to, and between, photomasks which are clamped for manual operation, on the same side of the pins' travel; a fixed spring-loaded pin, acting as an indexer to insure the stepping of the image; photomask clamps which, exercising pressure on a perforated metallic strip, hold the photomask rigidly and allows repetition of the lot, and the punching out of holes in the photomask for the insertion of locating pins; and spring-loaded glass insuring air-tight exposure of the photomask onto a pre-sensitized panel to be imaged. The apparaatus and method of pinning panels from the top surface down to insure stability in transporting them, permits accurate and automatic registration of a photomask onto a pre-drilled panel and allows a set of air suction cup-shaped members to remove a protective foil from the light-sensitive, exposed surface of the panel.

31 Claims, 13 Drawing Sheets

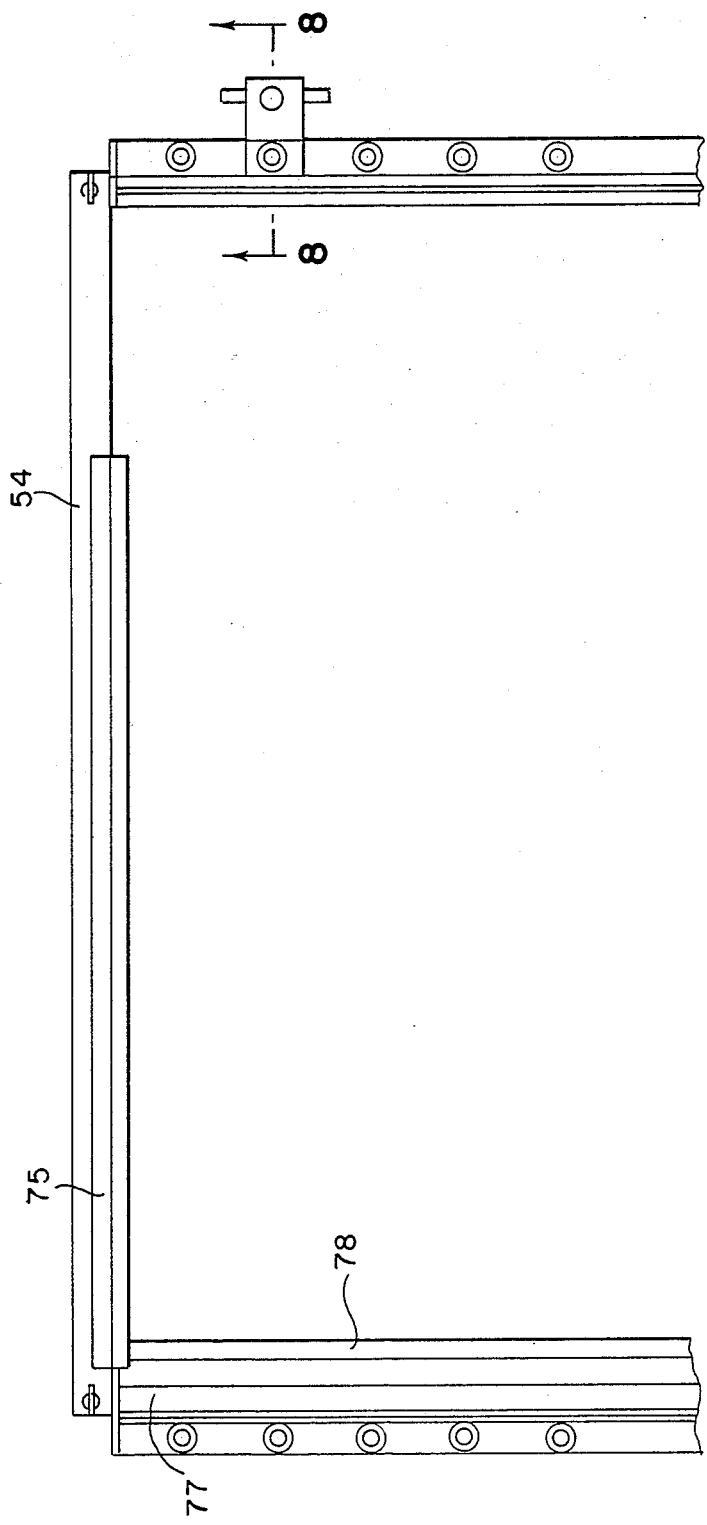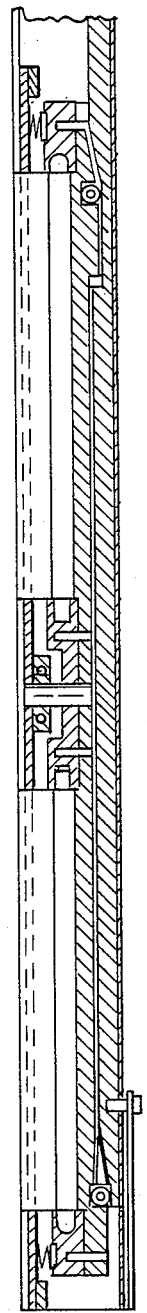

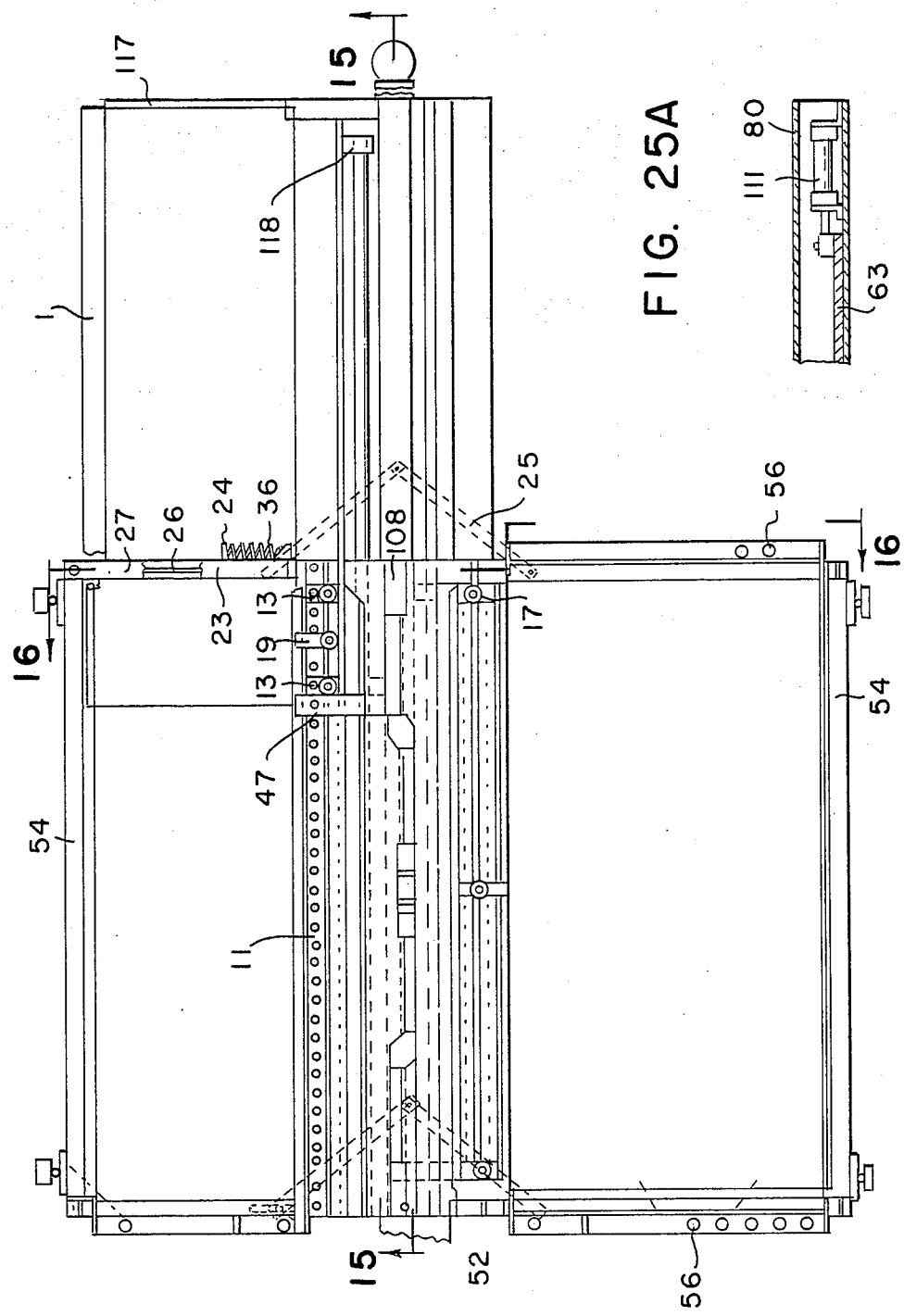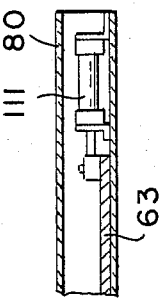

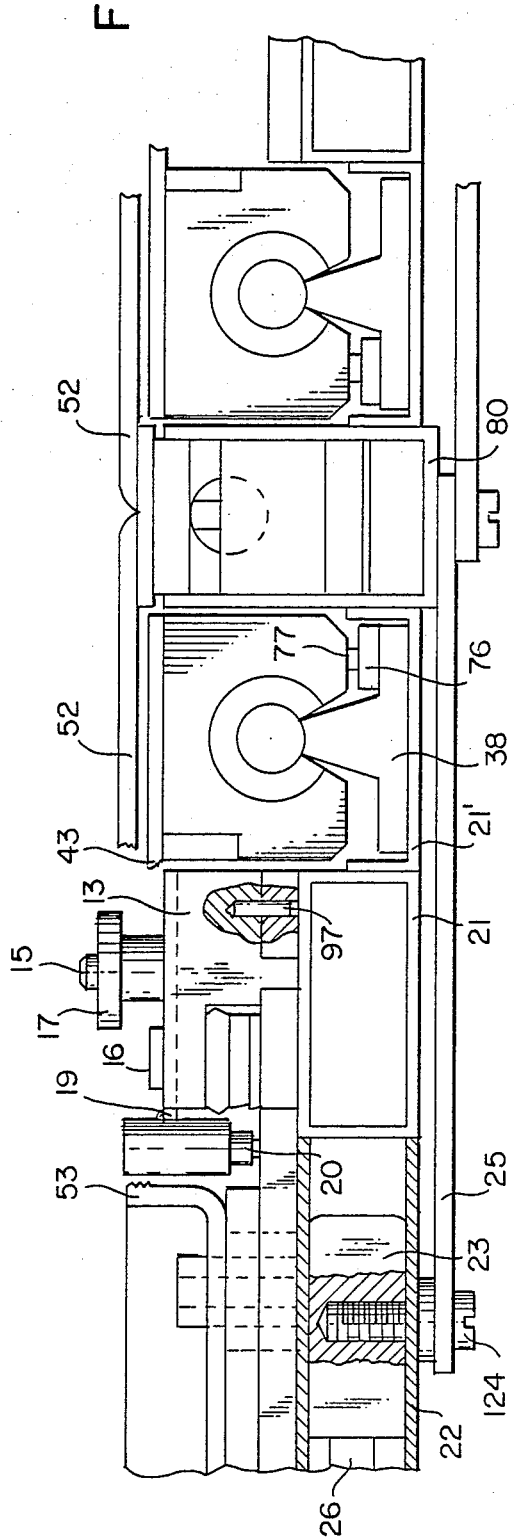
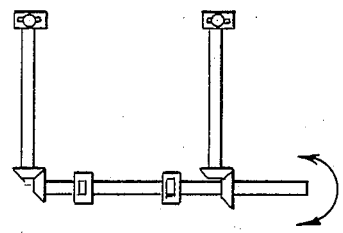
FIG. 19
FIG. 20
FIG. 29

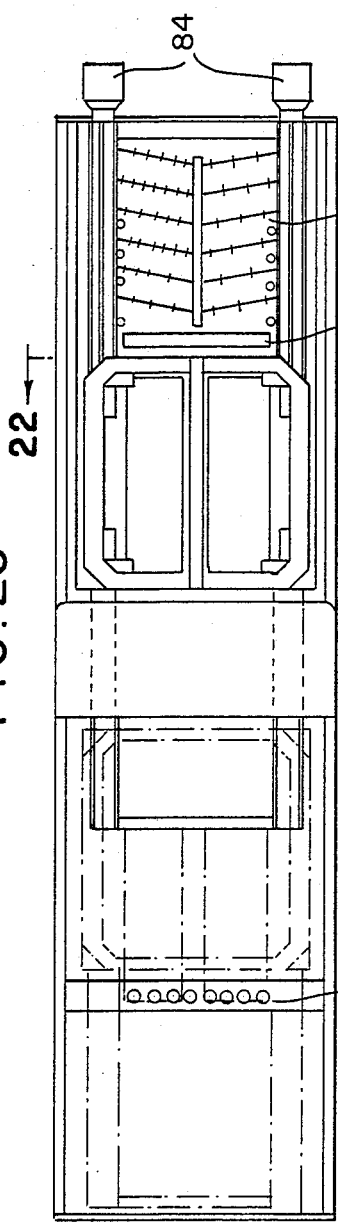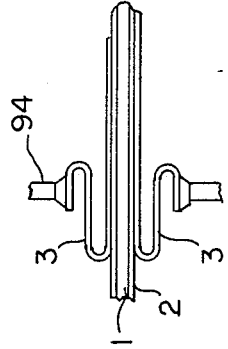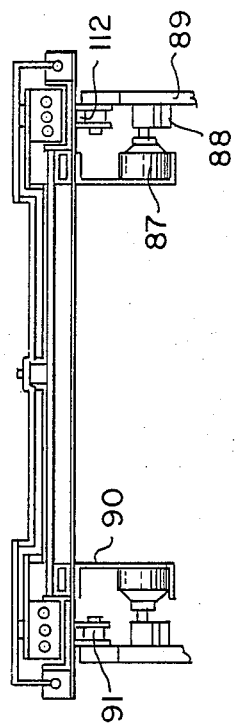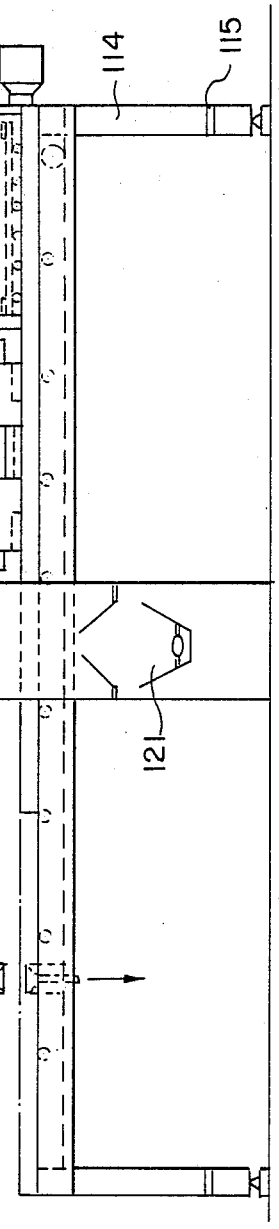

MULTI-PURPOSE APPARATUS FOR THE IMAGING OF PRINTED WIRED BOARDS

This application is a continuation of Ser. No. 929,978 filed Nov. 13, 1986 and now abandoned.

BACKGROUND OF THE INVENTION

1. Field of the Invention

This invention relates to the application of multiple operations in the production of Printed Wired Boards (PWB) or circuit boards which can be accomplished by the usage of a single apparatus. The operations contemplated are:

(a) Exposing a photomask from negative to positive and vice-versa, punching in both at the same time, a number of registration holes for the follow-up production, instead of doing so separately as it is done currently.

(b) Reproducing from a single image photomask a number of stepped-up images forming a bigger photomask, to produce larger quantity of PWB faster.

(c) Exposing with one image photomask a photosensitized panel, stepping the mentioned image photomask by moving the panel longitudinally, without needing to align visually the panel's holes with the photomask's pads as is currently done.

(d) To transport and bring in registration, due to its transporting and pinning technique, a panel's holes with a photomasks pad's centers, in an in-line fashion, from one operation to the next.

(e) Automatically removing a protective foil with vacuum cups after the exposure by holding or pinning technique of the panel which is done by inserting pins from the top into the panel's holes. This technique of clamping the panel to transport it is accomplished by the pins embedded from one end in at least two plates which clamp the panel along its longest side.

2. Description of the Related Technology

The principal step in manufacturing PWB is drilling the hole pattern. The vast majority of producers use numerically controlled, "X" and "Y" coordinates for programming machines which transduce the location of each hole onto a magnetic or code tape. In so doing, each hole's pattern can be electronically stepped and repeated as many times as limited by the panel's size and to each programmed image. To justify or align the working principle of the described apparatus, a hole can be added along its edge as part of the program. As the entire pattern is put on tape, it can be used to drive a drilling machine which, through a series of drilling spindles, repeats exactly what was programmed, except instead of positioning holes on the tape, it drills them on panels of dielectric material, mostly copper cladded. After the panels are drilled and their holes plated through, if desired, their surfaces are sensitized with UV light-sensitive polymer films. Their image, positive and corresponding to the PWB wanted on the photomask from which the drill tape was generated, must be matched, centers to centers, to the drilled holes. Such a matching or registering operation is done visually, but its precision or accuracy is impossible to predict or is very time consuming to achieve due to trials, since the pads and the conductors' line on the photomask are positive, i.e., the images on the photomask are extremely dense black. In order to overcome this problem, the industry developed a diazo film which has orange shaded lines and pads ratehr than black. The orange areas are not transparent to U.V. light but are sufficiently transparent to the eye to see the holes below. This film is expensive and time consuming to produce. Additionally, its transparency starts to break down and UV light penetrates the shaded areas not wanted to be exposed after repeated exposure. Even with such a visual aid, i.e, the diazo film, the matching or registration operation must be done with the holes of the presensitized panels throughout the production lot. This entails the loss of great amounts of time. To increase the registration productivity, most manufacturers punch holes in the photomask with locations corresponding to the extra hole, drilled on the panel and previously programmed. The operation need only insert a pin through the photomask's registration holes and the panel's registration holes to obtain the designed alignment. Separate tools to punch such holes on the photomask or adjustable exposing frames to bring the photomask and the panel's holes into perfect alignment are required.

SUMMARY OF THE INVENTION

The apparatus described herein is constructed so that alignment between photomask and panel is done once and with the negative so that the pads are completely transparent and the background dense black. The holes below are clearly visible and manual matching is only performed once and on the same exposing machine where the production also takes place. Once the negatives are visually or with the aid of a wide-view scope set in registration with the panel's drilled holes, and temporarily held on said panel by pieces of double-sided adhesive tape, the apparatus can provide a variety of operations which normally would be done on other machines or on adjusting frames. Some of these operations pertain to the preparation of the photomasks whether they are negative or positive, glass-based or transparent opaque areas, image stepping and repeating on the photofilm or directly on the photosensitized panel's surfaces. Greater importance is also attached to the programming of the drilling operation of a PWB which must provide an accurate step drilling of the image and an indexing hole likewise accurate, present on each image drilled on the panel so that the apparatus can position accurately the first time any panel's holes with its corresponding photomask's pads. Additionally, the apparatus has provisions to punch photomasks and with the same members can hold them in register for the production that follow; such punching or holding not only is provided by die strips located on the same side of the panel that is pinned to be transported, but can also be performed on the top glass frame to permit an automatic feeding of the panel into the apparatus. Furthermore, the pinning of the panel, accomplished by pins rigidly attached to strip metals by one end and pressuring said pins with a motion from the top toward the lower side of the panel's holes permit the operation of removing the carrying foil of the sensitized layer of the film, since the panel is held between said pins' plates and the conveyor's wheels upon which the panel rides. Furthermore, this pinning can also allow the panel to be transported under the photomasks, in registration, in the automatic version of the apparatus, and adjusted, if needed, by step motors which carry the panel to a preset coordinates position.

An object of the invention due to its design and production method versatility is to render several important operations of the PWB production easy, economical and more precise to accomplish. This versatility of design allows any operator to do his photo work in the same room and on the same machine were the production of the PWB takes place instead of using extra and cumbersome machines located in remote areas of the production plant. For both small and big shops there are savings in machine investment and time consumption of production of photo tools away from the production area and allow avoidance of contracting outside companies to make such stepped-up imaging.

Another object of the invention is to allow quick delivery of any prototype PWB which often holds up testing and production of entire machines or systems for any kind of industry.

A further object of the invention is to provide large and small producers of PWB with a common tool so that big and small production lots are made accessible to both.

A further object of the invention is to allow the processing of two different work pieces with different breadths and lengths, manually and automatically at the same time. Furthermore, the operation of stripping the protective film from the same panel after the exposing operation is facilitated by the primary technique. In practice terms, it means elimination of construction of costly stripping machines which currently are produced but are impractical and expensive.

BRIEF DESCRIPTION OF THE DRAWINGS

FIGS. 2-7 shows an enlarged view of the circled portion of FIG. 13.

FIG. 3 shows a section of the elevation view of the members to step and expose the laminated panel from a single imaged photomask.

FIG. 4 shows a section of the elevation view of all the members to expose a laminated panel with a glass photomask.

FIG. 5 shows an isometric picture of the exposing apparatus in its automatic version for an in-line production and the possibility of processing two panels at the same time, meaning automatic registration of the panels with their photomasks, carrying of the panels onto the next operation, and closing of the glasses. The opposite conveyor is omitted.

FIG. 6 shows the automatic version of the apparatus showing only half of it without conveyors.

FIG. 7 shows a section of the elevation view showing the main raising mechanism for the top frame glass.

FIG. 14 shows a plan view of the manual version of the apparatus, showing a central and common top frame lifting mechanism for the two top glasses, two pinning and punching assemblies to process two panels at the same time.

FIG. 19 shows an elevation of the front view of the manual version of the apparatus for two panel production showing in addition to FIG. 18 the panel's pin indexer.

FIG. 20 shows an elevation view as in FIG. 19, showing additionally the pins for the transport of the panel.

FIG. 21 shows an elevation view of the apparatus mounted on rails leading to and in an UV light exposing machine, and to a protective foil stripping station.

FIG. 22 shows a front view of the automatic version of the apparatus showing the top frame with its glass closed on the bottom glass, the transport pin blocks, and the lifting mechanisms, the rails with rack and pinions for the transport of the whole frame through the motors.

FIG. 23 shows only the top frame without glass in one unit for double and single panel processing for the automatic version of the apparatus.

FIG. 24 shows a side view of the panel showing how the protecting film is stripped by the vacuum cup members.

FIG. 25 shows a plan view of FIG. 21 showing the entry conveyor for the panel, the apparatus in the position of registration of the panel to the photomask, the exposing unit and the stripping station.

FIG. 25A shows an air cylinder within a lifting tube.

FIG. 29 shows an alternative mechanism for raising the frame.

DETAILED DESCRIPTION OF THE PREFERRED EMBODIMENT

Figure 2A:
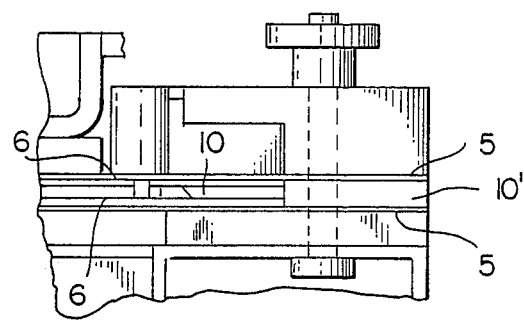
FIG. 2A shows an alternative embodiment of the member to step up a single image photomask.

FIGS. 1–24 show the details of each different embodiment taking in consideration the different operations which can be performed with the invention. The device has two basic frames, top and bottom, common to the different types of construction. Both feature rigid glasses 4, dismountable, which can be used either as direct photomasks, ready for production or to press independent photomasks onto a piece of work, air tight, to be exposed to actinic light going through them. The bottom frame is formed by a rectangular die-tube 21 which is perpendicular connected to one end of two other rectangular wedge tubes 95 which in turn are connected by their other ends to another rectangular tube 96 transversally placed, parallel to the rectangular die-tube 21 and all of the same height. A die-strip 11 is fastened on said die-tube 21, having its same length, and spaced all along its length from another strip 12 which is used as a locating member for the positioned for the piercing pin 16 of the L-shaped punch block 13. The position of said member 16 with the die-hole of the die strip 11 takes place in the moment the pin 97, as a fixed part of the punch-block 13 is inserted in one of the wanted holes 124 on strip 12; said holes bores, also laying in a row all along the length of die-strips 7, 10 are provided to be exactly in line, in pair, with the bolt 15. Said bolt is needed to secure such alignment so that the pin 17 can pierce, one after the other, top and bottom photomasks 5. Also to insure the stability of the punch block 13, the bottom part of said member is so formed to provide the action of a built-in key way sliding in the above said space between 11 and 12. Once the chosen holes are punched in the photomask, usually at a distance about its length, a turn-on knob 17 permits the members 13 to squeeze together the die strips 7 and 10, the photomasks 5 and 6 onto the die strip 11 through the squeezing of the oversized rubber member 98. Similar in shape to punch block 13, but without locating pin 97 and punching pin 16, the indexing block 99 has a forked member 19 sliding in a groove on its top surface. At the opposite end of the fork, a spring loaded pin 20, adjustable in height, housed in a tube connected to said member 19, provides for the exact positioning of the panel under the negative photomask, since the indexing hole 100 is present on each drilled pattern which was previously from the said photomask 5. Alternatively, the photomask can be punched and held down by strips 7 and 10 using only punch pin 16 with out punch block 13. Instead of sticking the single image 6 to member 7, it may be extended under punch block 13 with a spacer 10' between the upper and lower photomasks. The photofilm 6 to be step imaged is temporarily adhered by tape 3 on the panel and slides over and under the die strip 10 as shown in FIG. 2a.

At the end of wedge tubes 95, a small portion of their top surfaces is cut away to allow a nested C-shaped member 32, which hosts and guides a lifting mechanism of the top frame. Such mechanism comprehends a base, forked part 29 which nests a bearing whose holding pin 101 is overextended to the sides of the wedge tube 95 where a longitudinal slot 102 insures a perpendicular raising and lowering of said mechanism. Inserted in a bore provided on the top surface of member 29, a rotating stud 33 is held captive by set screws in said bore in a way that when being lifted by the wedge member 27, it lifts also the top frame with the glass and the photomask attached to it by means of member 54 which is in contact with member 33 through a slitted bore allowing said member 54 to sit under pressure due to the spring 31 on member 32 and to be pulled downward by member 34, placed crossway on said slot on member 54. This lifting operation takes place contemporaneously with the other wedge 63, installed in the main wedge tube 80, which lifts the opposite side of the top frame. Said top frame, guided upward and downward exactly parallel by stud 69 to the lower frame, insures also the paralellism of the photomasks which are clamped on them by the flat head screws 103 and were punched on the same glass by the punch die tools 56, 57, 58, 59, 60. Alternatively, the mechanism for parallel raising of the upper frame can be built with eccentrics or angled gears, driven by shafts as shown in FIG. 29.

The wedge tube 95 on the side connected with die-strip tube 21 contains a member 23 which rids in said tube, connected by a rod to wedge member 27, which is connected by a pin 24 to a flat member 25 which in turn is connected to the main wedge member 63. The pins 24, built alike on both sides of the frame, are respectively connected on tubes 95 and on the side of the sliding member 23 protruding through a slot provided on said tube 95. A spring 36, at least two per frame, serves the purpose of helping a manual force to retract said members 23, 27 in the operation of the exposure of the piecework. In the automatic version, the pin block 42 in FIGS. 6, 7, 22, 21 and 23 is also housed in a channel-like member 37 but this construction includes more than one rod 41 and their relative bearings 46 are closed round and at least one threaded bushing housed in at least one of the pin blocks 42. Furthermore, a flat elongated member 107 connects both pin blocks to insure the same distance between pins 106 which correspond to the same distance of the pinning holes on the panel 1. Said member 107 at least one on one of the pin blocks' ends, has a long slot in it with a wide head bolt prisoner it, screwed on the rear side of the pin block 42, in case a bigger panel must be used and consequently a bigger distance between pinning holes must be provided. Furthermore, on the top surface of said member 42, at least two keyways are inserted, tight fit; with each a threaded bore hole perpendicular to their top surfaces; said keyways are prisoner in slots 75 provided on each fork prong of a flat member 104 which ends, on the direction of said keyways, like a fork, and on the opposite one with a hinge, connected to another flat member 47, L-shaped, called pin-arm. Furthermore, a cubic member 73, connected under said pin-arm 47 and having a round protuberance facing downward, come in sliding contact with another L-shaped member 74 which is mounted on the front end of the pin-block 42 and having a slanted point in a manner to match the shape of said member 73.

Furthermore, a flat member with a threaded bolt attached to it is connected in the middle of the forks, perpendicular to said member 104 so that the center of said bolt is in line with a threaded slot 50 which is in line and connected with the shaft of a motor 51. To secure the motion of said member 104, flat bolt 48 is quickly screwed on the keyways 105 below without interfering with said motion of said member 104. Furthermore, by the action of said motor 51, member 73 raises itself on member 74 allowing the pin arm 47 to rise, and vice versa, and engaging and disengaging the panel in the following operations.

Figure 5:
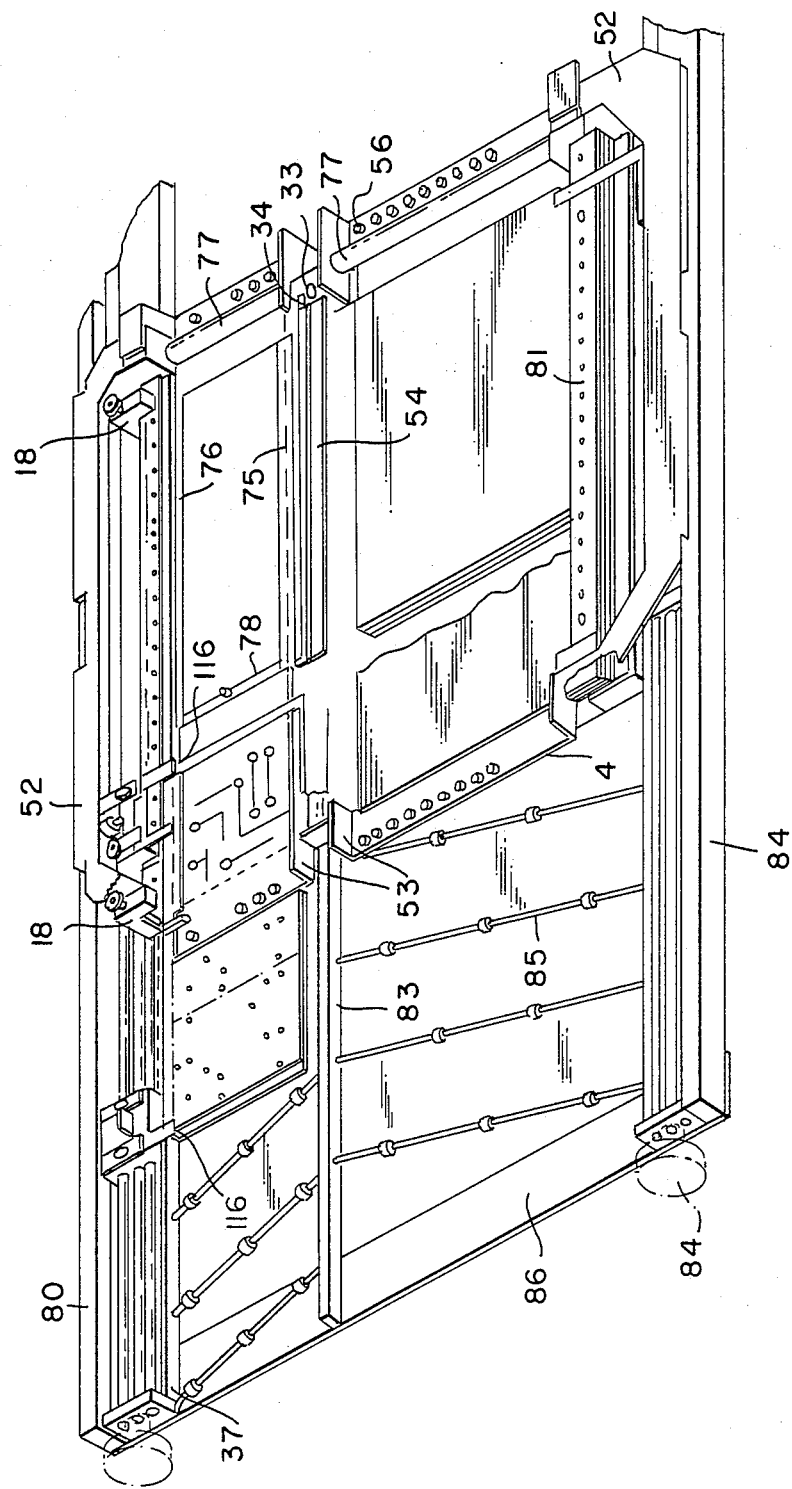
Figures 2, 3, 4, 5, 6, 7:
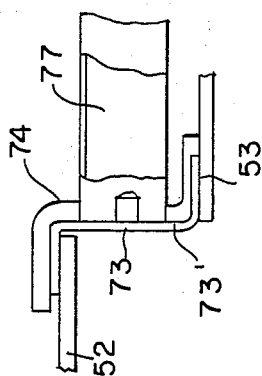
Figure 8:
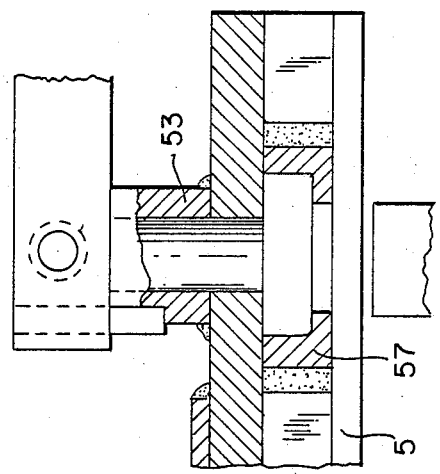
FIG. 8 shows a section of the elevation view of the glass and top frame where the aligning and holding bushing meet the punching die, aligned and set in the glass.

The longitudinal positioning of the pin block 42 is accomplished by at least two step motors 84 in FIG. 5. A channel member 79, connected in parallel to the die-tube 21, and extending all along the full length of the device, houses the panel's pinning and locating mechanism. The mechanism comes in two versions: a manual and an automatic one. The manual version of the pin block 42 in FIGS. 14, 16, 18 and 19 is formed by a T-shaped base member 38 which rigidly holds all along its concave top surface a rod 41 over which an open end bearing 46 rids, transporting with said pin block 42. A flat member 43 called the pin arm, extends on one end where the pin is located over the base die-strip 11 terminating with a short sleeve, housing the pin 106 which can slide in it and held in the wanted position by a set screw provided in said sleeve. On the opposite side of said pin arm 43, said member swivel around a pin which is tight fitted by its ends within a cavity's shoulders provided on the edge of the pin block 42 and loose fit in its middle portion coming in turning contact wth a sleeve member attached under the pin arm 43. Furthermore, to prevent the panel 1 and its metallic cladding 1' to slip out of the hold of pins 106 during its transport to be registered to the photomask exposed, and to have its protective foil 3 removed, a spring 44 at least one for each pin block is held by two pins 45 fastened on the side of the pin arm 43 on the lower end of pin block 42, pulls and keep said pin arm 43 tight on the top surface of pin block 42 and panel 1. Furthermore, to prevent the tilting of the pin block 42, a bearing 40 is connected by a pin and is free to turn in a cavity on the lower surface of member 42, protruding just enough to ride parallel to rod 41 and on the flat member 39, secured and fast to member 38.

Figure 2:
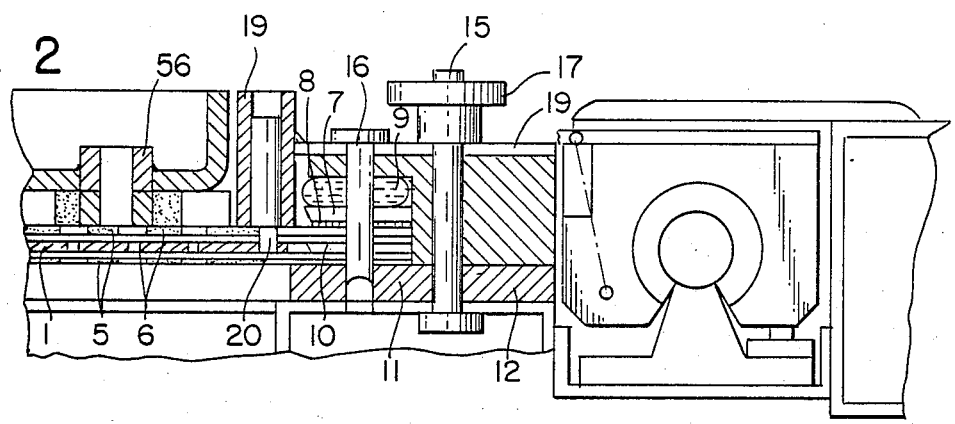
FIG. 2 shows a section of the elevation view of all the members to step and expose a photo film in multiple imaged photomask from a single imaged one.
Figure 3:
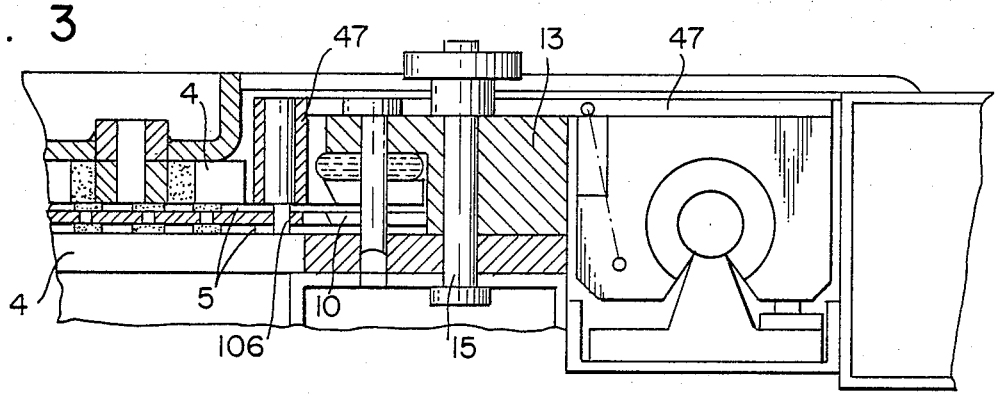
Figure 4:
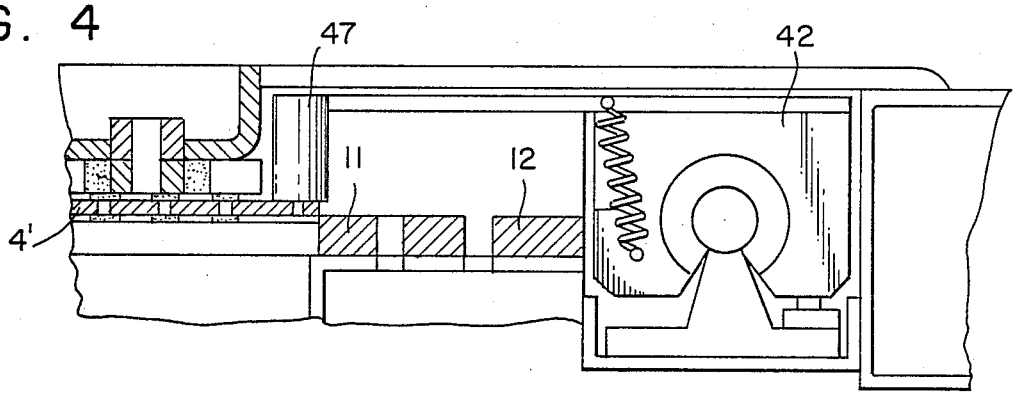
Figure 1:
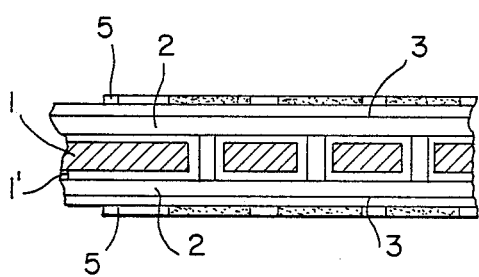
FIG. 1 shows a section of a double side panel with polymer film stuck on both sides as it enters the apparatus.
Figure 9:
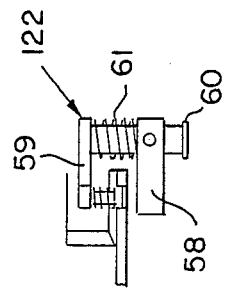
FIG. 9 shows a side view of the punching tool aligned to the frame's bushing and glass' die to punch the photomask.
Figure 10:
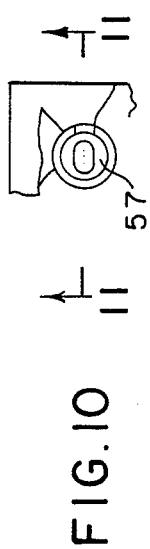
FIG. 10 shows a plan view of the punch die in the glass showing its oblong shape.
Figure 11:
FIG. 11 shows a section of said die.
Figure 13A:
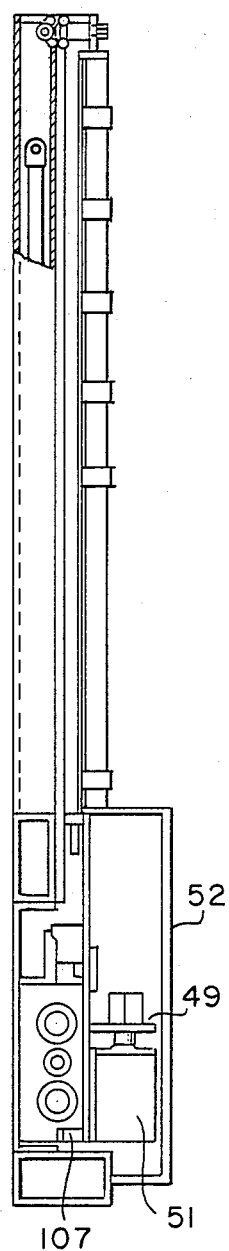
FIG. 13A shows a modification of FIG. 12.
Figure 12:
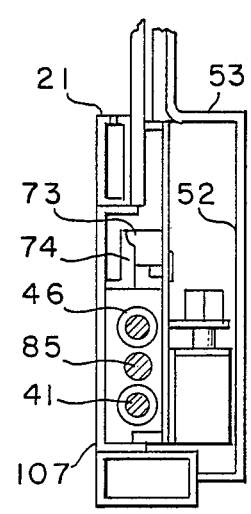
FIG. 12 shows a side view of the automatic version of the apparatus illustrating the main lifting tube, the table pin, the registration motor, the top frame with glass, the lower die set and the lower glass.
Figure 13:
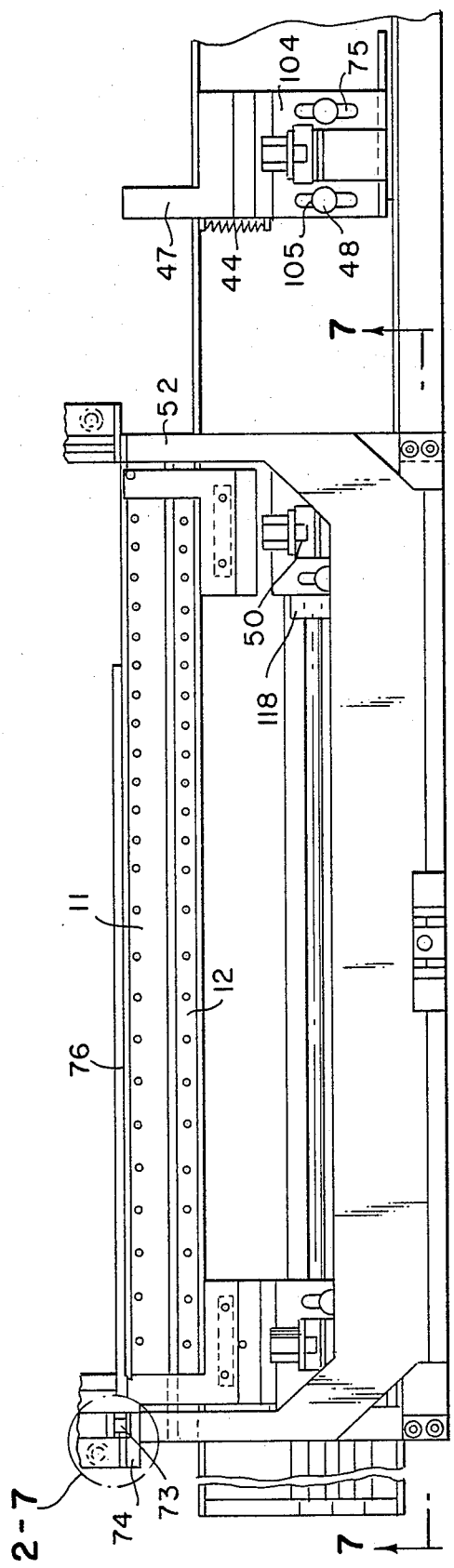
FIG. 13 shows an elevation view of the front end of the apparatus in its closed position. The top glass touches the lower glass.
Figure 15:
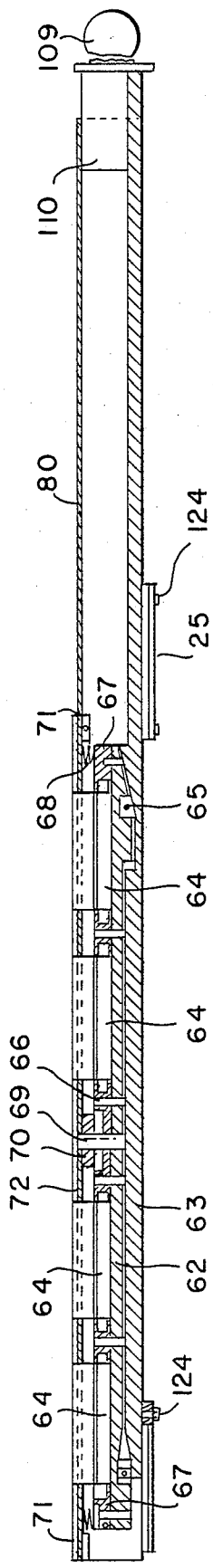
FIG. 15 shows a section of the top lifting mechanism of said double version of the apparatus.
Figure 16:
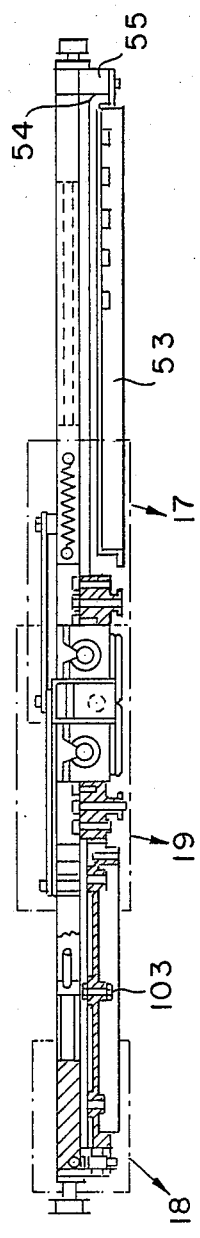
FIG. 16 shows an elevation view of the front side of the apparatus with a section of the peripheral top frame lifting mechanism, the photomask die-punch members, the pin blocks, the bushings to hold the photomask.
Figure 17:
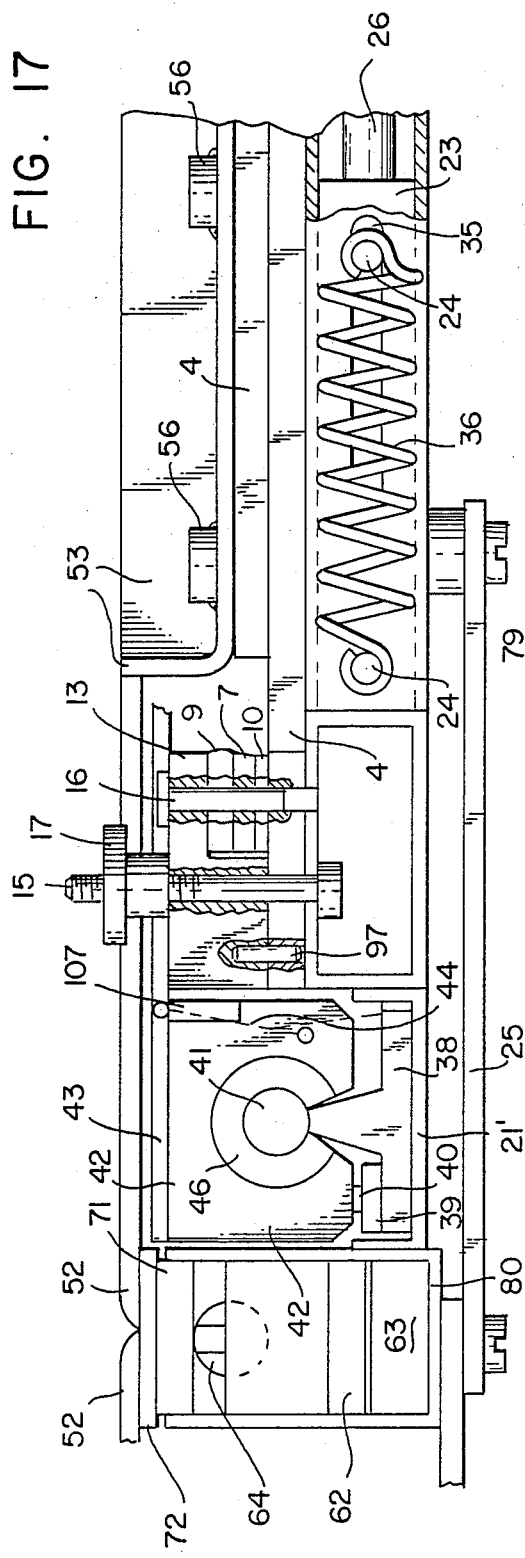
FIG. 17 shows a partial side view of the manual version of the apparatus for double panel production where the lifting mechanism tube, pin block and its base channel, pin arm, punch block with its punch pin, die strips, pressing strip, top and bottom glasses with bushings, spring and arms for peripheral glass lifting mechanism are shown in their closed position without photomask, panel, pins, or indexer.
Figure 18:
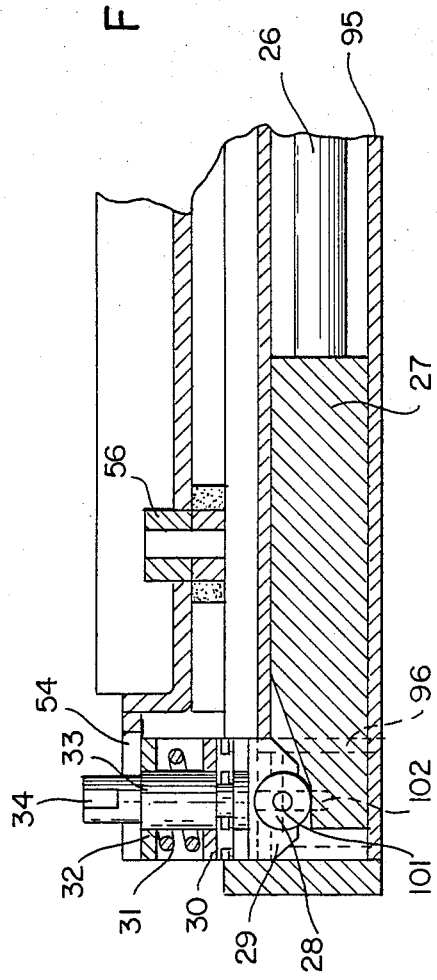
FIG. 18 shows a section of the peripheral lifting mechanism, in its elevation view, showing the lifting wedge in the closed position of top and bottom glasses, and the locking mechanism of the top frame and its bushings.
Figure 26:
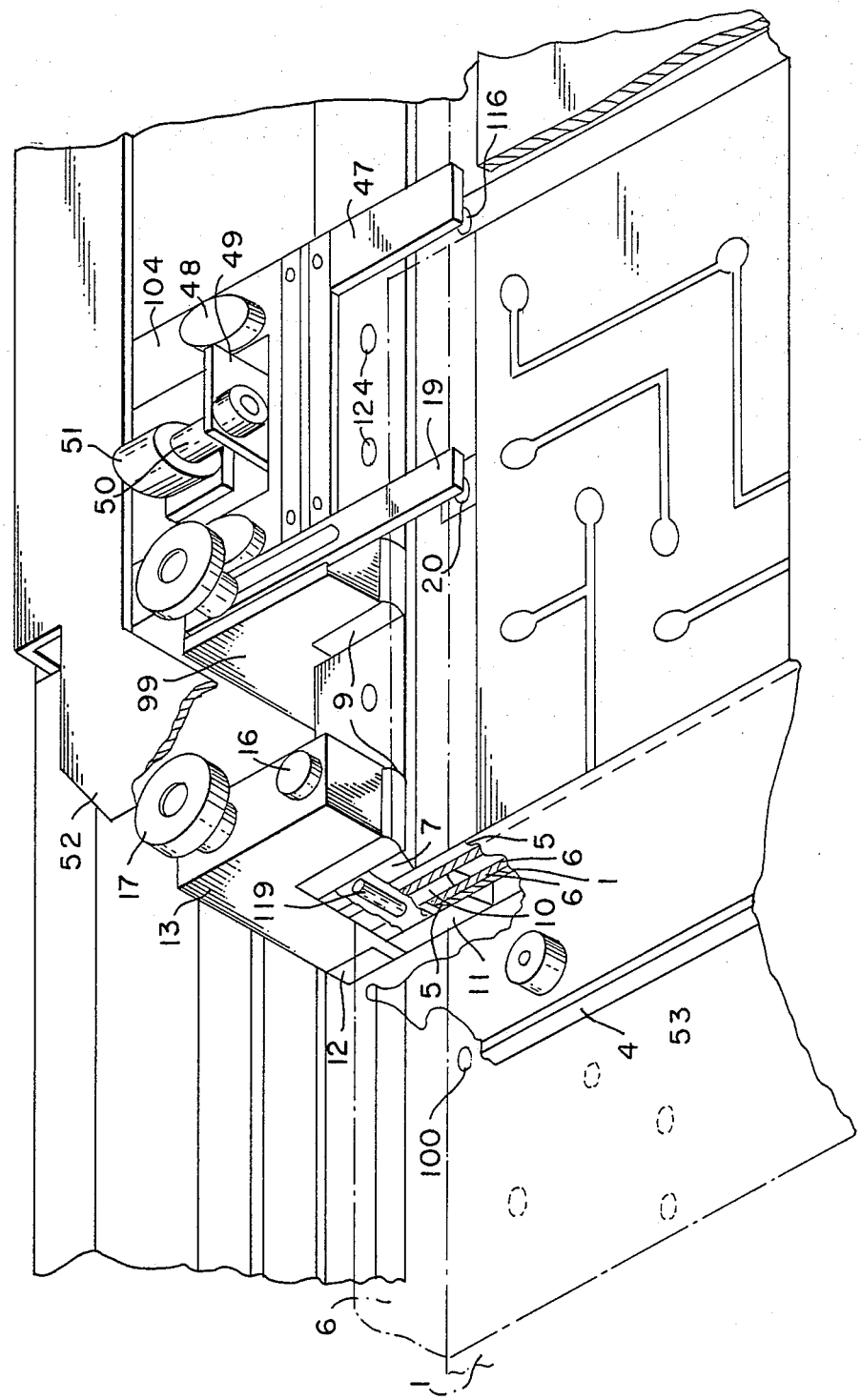
FIG. 26 shows an enlargement view from FIG. 5 showing the main members of the punching, holding of the photomasks, the indexing of the panel's drilled image, the negative photomask and the drilled holes on the panel below, the pin block with its adjusting step motor, and the photomask die punching strips.
Figure 28:
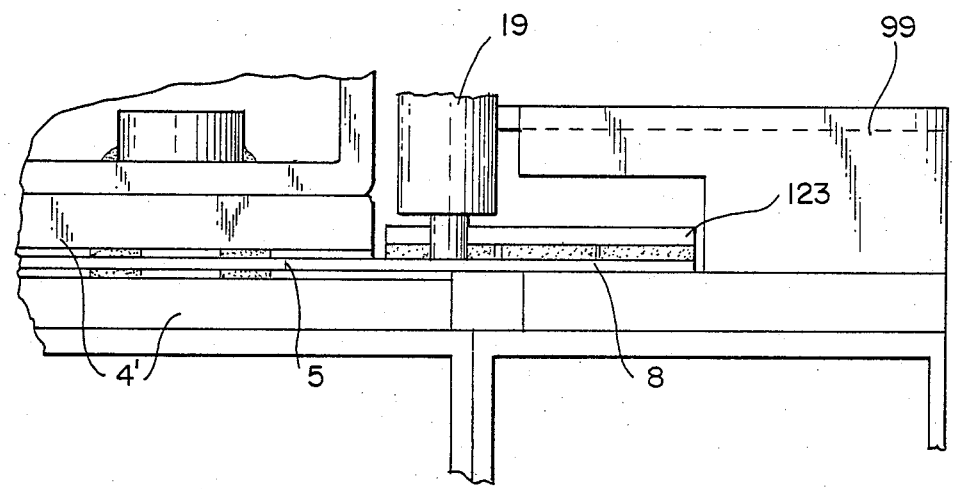
FIG. 28 shows the elevation view of FIG. 27 showing how the plastic photomask to be reproduced is attached to the auxiliary strip.
Figure 27:
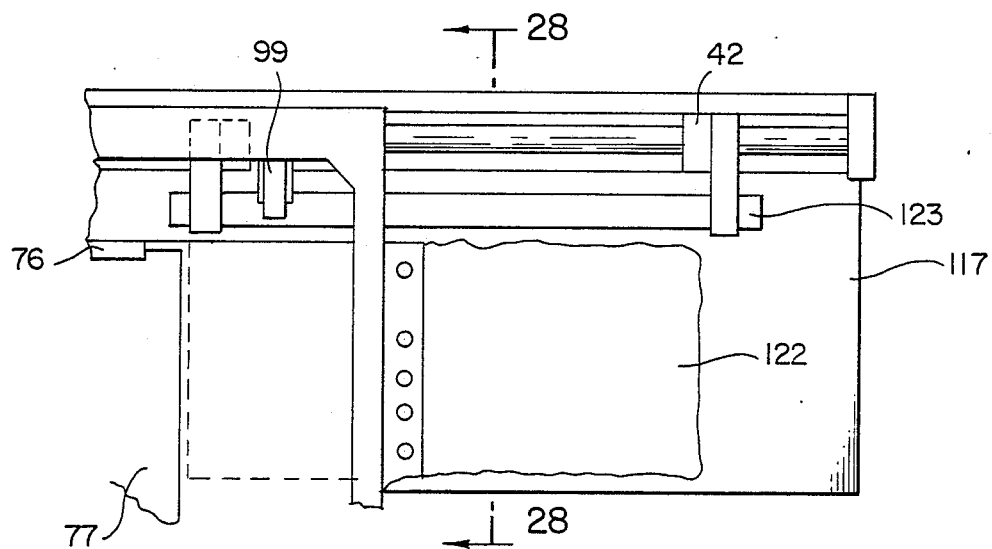
FIG. 27 shows the step and repeating application with an auxiliary strip of a photomask directly on the photoglass.

The top frame of the apparatus consists of an L-shaped member 52 which ends on one side with at least two rods 64 to swivel the whole top frame to set the photomask in place or to set the panel, for the manual version, under the pins 106 to be exposed. Said member 52 is attached by its forks, with at least two C-shaped ribbed flat members 53 on whose flat surfaces a row of bushings 56 are attached. Said bushings 56 are set in line to one another and parallel to another row of them set on the opposite side of the frame. Each row has another row below and perpendicular to it on the glasses 4 which are used to hold the glasses themselves and as die bushings to pierce the photomask. The tool punch used to pierce the photomask is shown in FIG. 9 and includes a member 60 around which a flat member 58 slides up and down holding a piercing member of different shapes. By different shapes, it is intended that at least one row of the die bushing 57 on the glasses 4 is preferred to be oval to accept any possible dilatation of the glass and of the photomask itself which may occur during operation. The upper part 59 of said tool is a flat member connected on one end to the main member 60 and to the other ends with a bore keywayed so that the shaped hole pierced on the phototool has always the same direction. On at least one of the members 53 of the top frame and parallel to member tubes 95, a rolled-up blind 77 is mounted. Said blind, non-transparent to any light, is held and rolled by one nd by a round shaft which has a bore hole on each fitting pin 73 mounted at the ends of the C-shaped members 53. The beginning of such a blind has a C-shaped member 78, fastened on it to stiffen such a blind and to guide it up to the edge of the photomask in the operation of stepping it in multiple images either on the coated panel 1 or on a normal photographic film. At the edges of member 54, which is a ribbed sheet metal connecting said member 53, A Z-shaped member 75 made of sheet metal is attaching which, together and opposite to another L-shaped member 76 attached to the edge of the top glass, provide a guide for said blind. On the side where the blind unrolls itself, an L-shaped member 74 extending its upper part toward the member 52, rigidly connects members 52 with 53 and at the same time holds also a Z-shaped very thin sheet metal, fast jointed member 73', on which pin 73, for the rotating of the shaft which unwinds the blind 77, is rigidly connected. See FIG. 27. At the end of the L-shaped member 52, rods 64, at least two for the automatic version and at least four for the double panel manual version apparatus in FIG. 4, are rigidly attached and inserted by their ends to swivel in block members 66, 67 which, in turn, are firmly bolted onto an elongated member 62 in which a common long slot is provided in which to insert said blocks 66, 67. At each end of said member 62, exactly on and where the member 67 are located, in line with the holding screws, a recess is provided to house a spring 68, a least one on each end, to exert pressure, through the top glass, so that the photomasks will adhere, air tight, to the panel's surface coated with UV light-sensitive photopolymer. Said springs are compressed by members 62 against a flat member 108 which is bolted at its end on a member 71, which in turn is connected, crossway, at the ends of an opening provided on the surface of the member 80. Said member 80 is in the main wedge tube, connected in parallel to the channel 37, which houses the panel's locating mechanism, and contains the main wedge member 63, which is rectangular-shaped and long enough to extend all the way to the end of the frame.

The member 63 has at least two wedges formed portions of its length built in, falling exactly under the location of at least two bearings 65 mounted under the lower base of member 62, and its height is low enough not to touch said member 62 during its forward and backward traveling. Furthermore, said member 108 has a block member 70 with a stud 69 solidly attached connected on its center part. As said member 109 is bolted on member 80 through members 70–71, an member 63, by its back and forth movement, raises the member 62 and top frame with it by sliding its wedges under bearing 65; the pin 69 guides said member 62 perpendicular and insures that its top frame, attached to it, rises and lowers parallel to the bottom frame and, by consequence, to and bottom photomasks contain their alignment. Furthermore, member 63, sliding and guided by member 110 in the inner low surface of the main wedge tube 80 is connected to it to at least two pines 24 rigidly inserted in the vicinity of its wedges. Said pins protrude in slots provided at the bottom of member 80, long enough to allow pins 24 to ravel a distance as long as the wedge's length. At least two flat members 25 held associated with and held in a swiveling arrangement are connected, laterally, through another pin 24 to member block 23 which slides perpendicular to member 63 in the wedge tubes 95. By applying a backward and forward manual force on knob 109 as in FIG. 14, or by an air cylinder 111 as in FIG. 25A, in the automatic version member 63 with its wedged portions, lifts and lowers member 63 with its side of the top frame, while at the same time, with its connecting members 23, 25, 26, 27, 28, 29, 30, 32, 33, 34 does likewise for the opposite side of the top frame. Referring to the automatic version of the invention in FIGS. 5, 6, 7, 21, 22, and 23, the members 21, 37, 80 and 95 and the top frame can either be duplicated as a group, namely: two frames built opposite to each other as in FIG. 5, with conveyors 82 built at the loading and unloading side where a stop bar 93 and a row of wheels 92, respectively, provide that the panel stops and is guided in a desired position, so as to be pinned and transported by the pin arm 47 and taken the registration station under the glasses 4 through the exposing machine 113 and to a row of air suction cups 94 where the carrier foil 3 is removed or as a group, but with one top glass as the frame, without locking and lfiting mechanism as in the wedge tubes 95 with all the members 28, 29, 30, 31, 32, 33 and 34 but having two main wedge tubes and its lifting mechanism with members 62, 63, 64, 65, 66, 67, 68, 69, 70, 71, 72, and 80 as in FIG. 15 and FIG. 22. Furthermore, said automatic version of said invention is driven through the exposure machine and the removal of the carrier foil 3 by motors 87 which, on both sides, are connected on C-shaped member 90, which in turn are connected on members 86 which are elongated strip of metal joining the two tubing groups for the lifting mechanism and panel positioning mechanism. Said motors, by means of their pinions riding on racks mounted on flat, elongated member 89, provide a linear motion for the apparatus to go through the above-said operations. At least two rows of wheels, guided by a long rectangular member 112 rigidly connected under the bottom frame, permits said linear motion of the complete apparatus, with the previously registered panels 1. Said members 89 are attached to other members 114 which, connected perpendiculary to them, in pair and reinforced by members 115, are elongated metallic bars supporting said members 114 functioning as supporting feet of the whole system.

In operation, the apparatus offers the following usage possibilities:

1. Set up of a single imaged photomask 5–6 and a consecutive exposure of each single drilled pattern of the panel, coated with polymer film. The top frame with the top glass are raised by pushing on knob 109. A single imaged negative photomask 5, top and bottom, is visually aligned through their transparent pads with their corresponding holes of the previous drilled panel 1 and a piece of the top photomask, about as big as the indexing hole 100, or bigger, on said panel, is cut out. On said panel 1, the drilled pattern of said image is already stepped up in as many steps as the panel's size can accept. Said single image photomasks 5 and the panel 1, already in registration, are then located on the flat surface 117 right before entering the apparatus, inserting the pins 106 of the forward table pin 43 in the forward hold 116, previously drilled, of the panel 1. The same is done with the pin of the back table pin and back hole on the panel. After this pinning operation is complete, a thin, double-sided adhesive tape about the same breadth as the photomask's is placed under the die aligner member 7 and over the base die strip 11. Consequently, the base die strip 11 is laid on the bottom photomask while being guided by at least two pins 119 embedded in the base die strip 11. The whole thing is then slid into the frame, meaning panel and photomasks, far enough to clear the back end of said photomask 5 in respect to the front wedge tube 95. Then at least one of the pin block 42 is tightened by its locking ring 118 to secure the panel and photomask position. Then it is the turn of at least two punch blocks 13 which are set by their pins 14 in at least two corresponding holes in the base indexer 12 and tightened by its bolt 15 and nut 17 so that the whole lay up will be pressed by the elastic pressing strip 9. By inserting the punch pins 16 into the punch block's forward hole, which corresponds to the aligned holes of the below die strips 10, 11, and applying pressure on it, the photomask will be pierced and will always retain its registration in respect to the panel's pattern holes. At this point, there is a differentiation to be made. Said negative photomask 5 can be used to produce a certain simple kind of PWB called "Print and Etch" or "Tenting", whereas the majority of circuits have not only copper as base metal as on said PWB but also precious metals as surface finish by electrodeposition. If the first type of PWB is desired, then the above set-up continues by installing the indexing block 99 in the interspace of members 11 and 12 sliding the forked member 19 and its pin 20 in the hole 100, previously drilled with the image drill pattern, and tightening the block by nut 17 on screw 15. The two blinds 77, top and bottom, are drawn up to the front edge of the photomask, intended, having the glass in between them. At this point, the top glass is lowered, and pressed by spring 68, 31, by withdrawing knob 109. The whole apparatus is pushed into an exposing machine 113, like a drawer, when tiltable blinds 120 are open to let light from lamps 124 out to expose said polymer file 2 on panel 1 through photomask 6. After the exposure time, the blinds retract, the glass is raised, the panel further pushed until the indexing pin sinks in the next hole 100 of the next drilled patter, automatically registering the photomask with the panel's hole. The exposed image is pushed under the blinds so that the exposure routine can take place again. In the automatic version of FIG. 7, the indexing block 99 is replaced by a step motor which can position the panel at X-Y coordinates, previously electronically stored. An electronic program can raise the glass, push the apparatus in and back out of the exposure machine by simply directing air cylinders, or other mechanical means, as in FIG. 25. In case a positive photomask must be used for above-mentioned electroplated PWB referring again to the previous set operation, after the piercing of the negative photomasks, the punch block 13 and its pin 16, the die aligner 7 with the negative photomask 5 stuck to it, the panel freed from the temporary pieces of adhesive tape to hold the photomasks prior to piercing, the top die strip 10 are all removed. Again, temporarily attached by adhesive tape to the panel, an unexposed photo film 6, one per each side, is laid and extended over the panel's pinning edge onto the die strip 11 and 10, then the top negative photomask, with the die aligner 7, are again set back in the previous position, and the punch block 13 presses against the whole lay-up.

This new set-up implies other applications which can be subdivided as follows:

A. The unexposed photofilm 6 can be pierced by the punch 16 and exposed, turning into a positive exactly in registration with the below-said negative. All that is needed is to remove said negative by going through the previous rouine, assembly of the punch block 13 and indexer block 99 again, and consequently expose the PWB for the plating application as previously done.

B. Instead of using an unexposed photofilm 6 of the size as above of the singe imaged negative photomask 5, said photofilm 6 can be chosen as big as the panel, extending over the punching die strips lay up and once again temporarily tape it to the panel 1. Once the indexing block 99 and the punch block 13 with members 7, 10 and 99 and blind 77 are back in the original position, going through the same routine as above, the singe image negative can be consequently exposed, reproducing positives, punched-in registration with the drilled pattern below. In reality a stepped and repeated positive can be produced, on one photofilm as big as the panel instead of reproducing it on the panel coated with the polymer film, like the previous case. In both cases A and B, all that is needed is to lift the top frame-glass and set another panel under the pins 20 by swiveling the arm pin 43 for exposing manually a production lot if desired.

C. A further manual method to expose panels without lifting the top glass can be achieved by bringing a variation to the above-explained way of punching the photomask. Once the said negative photomask are set in registration with the panel as prior said, only the bottom positive photomask is produced as prior explained, the top one will be made by removing the panel and the punching lay up, then be setting a photofilm 6 unexposed under the top glass which, to better work, should be removed from the frame, then punch at least two holes in said photofilm using the front row of bushings 57 which are in the glass, by using the punch tool 122. Next, slide fitted bolts 103 with a wide flat head and a threaded ends are inserted into said bushings to hold the photofilm. Its opposite end will be held either with adhesive tape, if a single imaged positive photomask is desired, or the punching operation will be repeated at said opposite end of the glass where another row of bushings 57 ar connected in it. Again bolts 103 are used to hold this end of the photofilm. There the die aligner 7 with the negative photomask 5 is set in the original punching position, clamped by the punch block 13. By the closing of the top glass, the two films are pressed together and light from the bottom is brought onto them and thereafter, through a developing step, a positive photomask is produced to expose PWB for plating applications. By having a positive photomask 5 punched and exposed from a negative one already punched in registration, means that at any recurrence of the same production type of PWB, all that is needed is to set the negative photomask 5 in the original punching position, bring the panel and its holes under the photomasks' transparent pads, lock the pin block 42 and replace the negative photomask with the positive one which was previously exposed, and already punched, from an opposite imaged photomask already in registration. By bringing the panel's holes under the negative photomask, it is not intended to adjust it, but manually push pin block 42 and panel with it from the loading place into the frame and lock it in the original position. For the automatic operation, this original position is given as an input to the stop motor 84 which, through a threaded shaft 85 will stop the panel on said position. When the whole panel is exposed with a photomask held by both rows of bushings 57, the blinds 77 are completely retracted.

2. Set-up and reproduction of the photomask directly onto the glasses as a production photomask.

A. A usually encounters, for long production lot of PWB, and to hold, in production, extremely accurate tolerances, some manufacturers prefer to expose PWB with a photomask as an integral part of the glass. Said glasses are previously coated, by companies specializing in the field, with light-sensitive liquids. Once coated and dried, such glasses can be exposed as a normal photofilm. The difference between both types of photomasks consists in the coefficient of dilatation of the glass and the plastic used. Plastic is the general appellation for different kinds of photomask materials, which, although they can provide a satisfactory performance for the great majority of applications, they still have a dilatation coefficient greater than glass. Using the same technique as previously explained of setting the panel 1 in registration with the negative photomask, whether single or multiple, is set back in the original punching position, on the base die strip 11 held only by pins 16 or on the rows of bushings 56, and light is conveyed through them onto the light-sensitive glass. The exposure takes place from the bottom light toward the top, for the top side of the panel's photomask, and from the top light down for the bottom side of the panel's photomask. But, alternatively, the glass not being exposed must be replaced temporarily by a standard, transparent glass so that the photomask 6 to be duplicated is air tight pressed between said glass and the "new to be" photomask to avoid stray light rays going under said photomask. The blind 77 will be used accordingly, whether single or multiple image photomask is desired. Once top and bottom glasses are reproduced in registration to one another and to the panel's holes, the production of the same panel lot follows by bringing the panel's transport holes 116 under the pins 20, either manually or automatically, as previously explained, which are preset always in the same position in relationship with the glass photomask position.

B. A further application of the device includes stepping and repeating a photomask, positive or negative, onto a glass photomask which, referred to the invention, a top and a bottom one, have a dual function. As photomask and as pressuring means to expose a panel's surface coated with polymer film without allowing any stray light going under the unexposed areas. Referring to a single imaged photomask 5 in FIG. 27, a metallic strip 123, bored with evenly spaced holes corresponding to the ones chosen on the panel, used to step the image 100 and the ones to transport the panel 116 is stuck by the double-sided adhesive tape 8 to the said single image photomask, after said photomask has been set in registration with the panel's holes and temporarily held with same pieces of adhesive tape. The whole package is set under the pins 106, then the tape is removed together with the panel and the indexing arm 19 by its pin 20 is set in the indexing hole 100. The blind 77 is closed in on the forward photomask edge, and its opposite edge is stuck with a non-transparent foil of thin and flexible material 122 extending up to the panel's length and resting on surface 117. By the closing of the top glass frame 4, which in this case is chosen to be a normal transparent glass, the apparatus is inserted in the exposing unit having only the top light exposing the photoglass if said photoglass is the bottom one, and the bottom light if the top photoglass is the one to be exposed. The procedure continues by pushing the strip 123 to the next indexing hole 100, by retrieving the blind 77 so far to uncover the next image-space to expose. As the single image photomask goes forward, the foil 122 covers and protects the space of the photoglass already exposed. The same routine is used to produce the top photoglass with the difference that the bottom photoglass would have to be replaced, temporarily, by a normal transparent glass to allow the exposing light of the bottom lamp, to expose the top photoglass. Once the top and bottom glasses turned into multiple imaged photoglasses, a multiple image-drilled panel of the same type can be exposed repeatedly through the production lots.

C. A further application of the apparatus involves reproducing, from an independent single or multi-imaged photomask, said photomasks directly on the glasses, top and bottom, of the apparatus. These photoglasses being coated with light-sensitive material incorporate a dual function: as a glass photomask or photoglasses and a mechanical means to hold and press the panel in registration. Using an independent photomask, multiple or single-imaged, which has been registered and punched as previously mentioned, either on the base die strip 11 and its component members 8, 9, 10 and 13 or on the bushings row 56 of the top frame 53 or the bottom row of the glass 4, said photomask is set back in its original punching position, and held either by pines 16 or bolts 103, whichever system is chosen. By lowering the top glass with its photomask attached to it on the lower one, the photomask to be duplicated, whether negative or positive, will be airtight squeezed to allow the light to strike only the transparent areas. This routine is repeated twice, if the panel is on both sides imaged, having the bottom light strike the top photoglass and the top light strike the bottom photoglass. For the manual applications, the panel will be first pinned and pushed under the said photoglass 6 but in order to find its original registration position with the positive photomask, when this is the case, the original negative photomask is set back in its original position to match the pads with holes below, the stop ring 118 tightened to insure the position of the pin block 42, and said negative photomask will be withdrawn again. Any following panel can be pinned as before, its forward-carrying pin block 42 will stop against stop ring 118, and the top photoglass can be closed and pressed on the panel laying on the bottom glass.

For the automatic version, the panel's original registered position will be simply achieved by letting the step motor 84 drive the pin block 42 on threaded shaft 85 to X-Y coordinate, electronically measured, at the time of the punching of the photomasks.

I claim:

1. A multi-purpose apparatus for the manual and automatic imaging of Printed Wired Boards, comprising:
    a base frame formed by a group of rectangular tubes and a channel, rigidly attached and parallel to each other differently to suit the various applications of the apparatus and connected:
        on one side for a manual or automatic operation in processing one panel's breadth;
        in the middle, for manual or automatic operations to process two different or equal panel's breadth;
        one group on each side, attached to each other by a conveyor, to process automatically and in line two panels at the same time;
    one tube of said group being somewhat shorter and also rectangular, is connected transversally to two more tubes of the same height, which in turn are connected to a third one also transversally;
    attached to said rectangular member tube, on its surface, at least two metallic die strips uniformly interspaced and extending to the whole length of said tube, have rows of die holes used as punch dies to perforate photomasks before exposure and to align a punching pin, sliding through at least two L-shaped punch block members clamped on said holes by a bolt and thumb screw going through it, an L-shaped member, likewise said punch block members, clamped to the said holes, having a sliding member, in its grooved top surface which has its back end shaped like a fork and attached to its front end, an indexing spring-loaded pin; and a glass resting on said transversal tube members having the same height of said prior die strips.

2. The apparatus according to claim 1 whereas at least two arm pin-like members, sliding on and together with pin-blocks ride, driven together manually or by a motor by means of a long threaded shaft or, if desired, by an air cylinder mounted parallel to said rods, comprising:
    at least one swivel member for each said table member at which end a pin is rigidly mounted, facing and pulled by a spring downward on the panel's upper side holes, to press on said panel and carry it through the process;
    a connecting member between the said tables, adjustable on one end and fixed on the other end to permit the processing of different panel lengths.

3. The apparatus according to claim 2 whereas said table members travel in said C-shaped profile carrying, parallel to their axis, the panel and being supported by a T-shaped elongated member which supports said table and their bearings, through shafts rigidly connected to it.

4. An apparatus according to claim 3 whereas attached to said C-shaped channel member of the pin block and to a central elongated bar separating the two entering panels, at least two converging conveyors are provided, to direct the said panels against a straight edge, frontally placed, and a row of small wheels placed on the side of the pinning table against which the panels stop to be inserted by said pinning table.

5. The apparatus according to claim 2 whereas at least two motor-drive plate, riding on the flat surface of the above-said tables, ending on the motor side like a fork and hinged on its front end to the above-said swiveling pin members and riding perpendicular to the panel's direction, insures, for the automatic positioning of the photomask and panel, a pre-programmed alignment of the latter.

6. An apparatus according to claim 2 whereas a plate set rigidly on and perpendicular to the plate riding n the surface of the table pins, and located in between the forks forming sid sliding plate, has a bolt connected to it so that a motor shaft, by driving a threaded shaft into said bolt, swivel the front part of said table pins which, by the anchoring action of said pins, the panel is set in a pre-set position in relation to the photomasks.

7. An apparatus according to claim 6 whereas an L-shaped member with a slanted point, connected on the side of the pin block, provides, together with another pointed and slanted member located under the swiveling part of table pin, a lowering and rising action of said table pins, so that such pins fall in and over the panel's holes waiting in a preestablished position, ready to be transported in a preprogrammed exposing position.

8. An apparatus according to claim 7 whereas two slots are provided in the forks of said table pin which forces it to move only forward or backward since, in each slot, an elongated cubic member with a bolt screwed on it restricts any lateral movements of said plate.

9. The apparatus according to claim 1 whereas the image of any PWB can be transferred with a flexible photomask already aligned with the panel's holes, onto a pre-sensitized photoglass and used in production not only as the image to transfer onto a coated piece work but also as the support basis of the whole frame.

10. The apparatus according to claim 9 whereas said photoglasses, top and bottom, and their images, through a row of round and oval bushings, provided in the glasses and matching with pins set on the supporting tube frame for the bottom glass, and alike bushings set on the top frame for the top glass, always in close alignment with the panel's holes since the distance of said photoglass image from the holes of the above-said die strip is the same because the distance of the flexible photomask and its punched holes which reproduced the photoglass from said holes on said die strip are the same.

11. An apparatus according to claim 10 whereas a set of flexible negative photomasks, top and bottom, can be aligned visually with said panel's holes correctly, without later adjustments, one time, having at least two holes punched on the same frame by the die strip to retain said alignment in case of repeated production lots.

12. An apparatus according to claim 11 wherein a single image photomask, preferably negative, once aligned with the underlying panel holes, and punched with at least two holes to retain said alignment, can be stepped up or repeatedly reproduced either on the panel coated or laminated with a light-sensitive film or onto a normal flexible unexposed photomask.

13. An apparatus according to claim 12 whereas a set of litho negative photomasks or a set of transparent positive diazo photomasks can be registered or aligned only once, punched with holes to retain said registration on the same side where the panel is held by at least two pressing pin-arms and held by at least two punch block L-shaped members by pressing through a bolt on said die-aligner, top die strip, bottom die strip, all superimposed, held aligned by at least three pins and guided by them in their vertical floating while being pressed by said punch block through a rubberized elastic rectangular member stuck on said punch-block.

14. An apparatus according to claim 9 whereas the top glass of said frame can be used directly as a production glass photomask also called photoglass by having the top photomask (litho) already punched in registration with the films holding panel, closing the said sensitized top glass onto the bottom glass, after removing the panel, and exposing from a bottom light, through the litho photomask onto the top sensitized glass.

15. An apparatus according to claim 14 whereas unexposed top and bottom photomasks can be punched directly on their adjacent top and bottom glass by means of a plier punch and the die bushings provided on the glasses, expose them with the mater photomasks already visually matched in alignment with the panel holes which are held in place by pins mounted on movable tales alongside said glasses.

16. An apparatus according to claim 1 whereas the top part includes:
a frame extending, left to right, according to the panel direction, from and over and the panel positioning pin block, over the bottom glass and terminates with holes at its right side to provide for a locking and raising action of said frame;
the left part of said frame, transversally seen going over the panel positioning pin block, assumes the form of a L-shaped one end of it terminates connected with at least two rods which provide the fulcrum to tilt the frame, the other ends shaped like a fork.

17. An apparatus according to claim 16 whereas connected to the prongs of such a fork-shaped member, at least two other extending C-shaped members are protracted and rigidly connected to a transversal flat member, all ribbed by a perpendicular member to strengthen said members against bending.

18. An apparatus according to claim 17 whereas at the extreme ends of said C-shaped members, a row of punch die bushings is provided for the piercing of the photomask and the holding of the top glass.

19. An apparatus according to claim 18 whereas said main wedge tube extending to the full length of the apparatus is open on its upper back by a portion as long as to accept the lifting block and at its ends a support rectangular member rigidly connected to the inner walls of said tube with at least two threaded holes on it to bolt an elongated guide plate which has openings to allow the L-shaped portion of the top frame and its swiveling rods to move freely, and furthermore on the lower surface of said wedge tube, two slots are provided to let pins connected to the wedged member longitudinally float in it, so that the longitudinal travel of said main wedge member is transmitted laterally to the peripheral lifting mechanisms, through a connecting, secured and swiveling flat member, to shorter flat members, also wedged, residing in tubes connected perpendicular to said main wedge tube of said peripheral lifting mechanism.

20. An apparatus according to claim 17 whereas a shaft rotating and held by its ends by two short, round stubs, having a blind wrapped around in a way that by unwrapping it, the side edges of said blind are trapped and guided by two L-shaped members attached, one to the said top frame and the other on the edge of the top glass.

21. An apparatus according to claim 20 whereas a sturdy C-shaped member attached at the beginning of said blind serves the purpose, when drawn by said member, of preventing the already exposed images to be damaged by the actinic light in the process of multi-imaging.

22. An apparatus according to claim 21 whereas a glass serving as base and as a photomask or as base alone to accept independent working photomask, at which end, embedded in it, at least a row of die bushings of round and elongated shape, serve the purpose of holding, through pins inserted in them, an independent photomask to said glass and to punch in said photomask at least two holes to retain the registration previously achieved. The distance between said bushings must correspond to the bushing interspace provided on the top part of the above-mentioned C-shaped members.

23. An apparatus according to claim 17 whereas the ends of the rods attached to the L-shaped end of the top frame are nested freely to turn, in bore holes provided in rectangular block members which in turn are bolted on to an elongated common rectangular lifting block member.

24. An apparatus according to claim 23 whereas the said lifting block is an elongated rectangular member having a slot running all the way through its top surface in which said short block members are bolted and permitting the frame to swivel in bore holes provided parallel in said blocks and in slide fit tolerance with rod ends of the top frame, furthermore, at each top extremity of said block, a cavity nests a spring which allows pressure from the top glass frame onto the bottom one and also at each lower surface of said member, at least two bearings are connected by pins onto the main body of said members, between a slot provided in the lower surface, so that they just protrude from said member to ride on another elongated wedged member extending the whole length of said lifting block on whose middle, going from the top surface all the way through its bottom, a bore hole is provided to allow said lifting block to travel upward and downward, parallel to the glasses, by means of a stud sliding in said bore and attached fast to a rectangular block which in turn is rigidly mounted to the main tube nesting the central lifting mechanism.

25. An apparatus according to claim 24 whereas said rectangular wedged and elongated member extending to the full length of said apparatus is pushed forward to raise the top frame with its glass on it and backward to lower it, being laterally restricted of any movement by the inside surface of the main wedge tube nesting the whole lifting mechanism.

26. An apparatus according to claim 1 whereas two rectangular wedge tubes, running parallel to one another, rigidly attached on one end to a transversally running die strip tube, and on their opposite ends to another transverally running tube on the same height, a surface portion of said ends is removed so that C-shaped members replace them by being firmly attached in a manner that the new surface height is built together with a higher cavity at the end of said tubes on whose side surfaces toward the glass slots are provided to allow the extended pins of a forked member of the lifting mechanism, to guide and secure said member in its ascending and descending traveling.

27. An apparatus according to claim 26 whereas a top glass peripheral lifting mechanism consists of a fork-shaped member having a bearing mounted in the lower forked area of said member, and a stud inserted in the higher cavity of said forked member, in a way that it can rotate without being allowed to escape upward by at least two set-screws riding in a slot on the lower end of said stud, and the upper end of said stud terminates with a crossway slot filled by an elongated rectangular member fixed to said stud by a spine, and a spring around said stud provides that the right end of the top frame and its glass are pulled down through said forked member under the force of said spring.

28. An apparatus according to claim 27 whereas a rectangular wedge member, sliding in said rectangular tubes and under said ball bearings, provide the right peripheral side of the top frame to rise parallel over all its surfaces.

29. An apparatus according to claim 28 whereas a rod rigidly connecting said wedge members with another rectangular member in the same tubes, receives a force to move the wedged member forward by a flat and elongated member, which is connected, but able to swivel, on one end, to said rectangular member by means of a pin rigidly connected to said member and on the other end connected the same way to the main wedged member through a slot provided on the base of the main wedge tube.

30. An apparatus according to claim 1 whereas under said C-shaped channels and the die strip tubes, additional C-shaped channels, attached longitudinally, long enough to extend to further process steps, on both sides of the bottom part of the apparatus, also provide an anchoring place for motors, which, with their pinions exerting a forward push on racks mounted on long rectangular members forming a supporting frame together with additional rectangular members acting as supporting pillars of the whole system, allow the apparatus to ride through the various operations.

31. An apparatus according to claim 30 whereas all along said rectangular members supporting pinions, wheels are provided and connected to their upper inside surface which, in riding contact with long rectangular rods rigidly attached under the said channel of the table pin mechanism, permit a linear travel of the apparatus through the process.

* * * * *